United States Patent
Venkata et al.

(10) Patent No.: US 7,138,837 B2
(45) Date of Patent: Nov. 21, 2006

(54) DIGITAL PHASE LOCKED LOOP CIRCUITRY AND METHODS

(75) Inventors: Ramanand Venkata, San Jose, CA (US); Chong H. Lee, San Ramon, CA (US); Henry Lui, San Jose, CA (US)

(73) Assignee: Altera Corporation, San Jose, CA (US)

( * ) Notice: Subject to any disclaimer, the term of this patent is extended or adjusted under 35 U.S.C. 154(b) by 778 days.

(21) Appl. No.: 10/349,541

(22) Filed: Jan. 21, 2003

(65) Prior Publication Data

US 2004/0140837 A1   Jul. 22, 2004

(51) Int. Cl.
  *H03L 7/00* (2006.01)
(52) U.S. Cl. ................................. 327/152; 327/153
(58) Field of Classification Search ................ 327/147, 327/149, 150, 152, 153, 156, 158, 159, 161; 331/17, 25, DIG. 2; 375/374, 375, 376
See application file for complete search history.

(56) References Cited

U.S. PATENT DOCUMENTS 6,100,735 A * 8/2000 Lu .............................. 327/158

| 6,125,157 | A | 9/2000 | Donnelly et al. ............ 375/371 |
|---|---|---|---|
| 2001/0033188 | A1 | 10/2001 | Aung et al. ................. 327/141 |
| 2002/0190751 | A1 | 12/2002 | Lee et al. ...................... 326/39 |
| 2003/0006808 | A1 | 1/2003 | Weng et al. .................. 327/99 |
| 2003/0012322 | A1 | 1/2003 | Partsch et al. .............. 375/376 |
| 2003/0052709 | A1 | 3/2003 | Venkata et al. ............... 326/37 |
| 2004/0085974 | A1* | 5/2004 | Mies et al. .................. 370/406 |

FOREIGN PATENT DOCUMENTS

EP   1 113 616 A2   7/2001

OTHER PUBLICATIONS

U.S. Appl. No. 10/059,014, filed Jan. 29, 2002, Lee et al.
U.S. Appl. No. 10/273,899, filed Oct. 16, 2002, Venkata et al.
U.S. Appl. No. 10/317,262, filed Dec. 10, 2002, Venkata et al.
U.S. Appl. No. 10/317,264, filed Dec. 10, 2002, Venkata et al.

* cited by examiner

*Primary Examiner*—Linh My Nguyen
(74) *Attorney, Agent, or Firm*—Fish & Neave IP Group Ropes & Gray LLP; Robert R. Jackson

(57) ABSTRACT

Phase locked loop circuitry operates digitally, to at least a large extent, to select from a plurality of phase-distributed candidate clock signals the signal that is closest in phase to transitions in another signal such as a clock data recovery ("CDR") signal. The circuitry is constructed and operated to avoid glitches in the output clock signal that might otherwise result from changes in selection of the candidate clock signal.

28 Claims, 4 Drawing Sheets ated signals having phase earlier than the transitions, and a second of the preliminarily selecting signals having phase later than the transitions. The second preliminarily selected signal is used to clock a final selection request signal through a delay chain, and the final selection request output by the delay chain is used to make a final selection between the preliminarily selected signals.

DIGITAL PHASE LOCKED LOOP CIRCUITRY AND METHODS

BACKGROUND OF THE INVENTION

This invention relates to phase locked loop ("PLL") circuitry, and more particularly to digital phase locked loop ("DPLL") circuitry.

PLL circuitry is a frequently needed type of circuitry. For example, in the reception of clock data recovery ("CDR") signals, PLL circuitry may be used to help match the frequency and phase of a controllably variable clock signal to the clock information that is embedded in the received CDR signal. The frequency-and-phase-matched clock signal can be used as a "recovered" clock signal, which is useful, for example, in processing the data information that is also recovered from the CDR signal.

PLL circuitry may include a "digital" portion ("DPLL circuitry"). For example, after a frequency match has been achieved, several versions ("candidate clock signals") of the frequency-matched clock signal may be produced. Each of these versions is shifted somewhat in phase relative to the other versions. The digital portion of the PLL circuitry may be used to make a final selection of the version that has the best phase match. Relative stability in such a final selection is important (e.g., to avoid final selections that change too soon (prematurely) or too often ("hunting")). Also, it can be important to avoid "glitches" in the recovered clock signal. Glitches can be associated with certain types of changes in the final selection of the clock signal version to be output as the recovered clock signal. A glitch is typically one or more signal transitions that are fragmentary or too close to one another or to other transitions in the recovered clock signal (i.e., signal transition spacings that are too small a fraction of a proper recovered clock signal cycle).

SUMMARY OF THE INVENTION

In accordance with certain aspects of the invention, the one of a plurality of phase-distributed candidate clock signals that is closest in phase to transitions in another signal (e.g., a CDR signal) is selected by preliminarily selecting two of the candidate clock signals that are adjacent to one another in phase and such that at least one of the preliminarily selected signals has no other candidate clock signal with phase between it and the transitions. A final selection is then made between the two preliminarily selected signal, but a change in the final selection is only allowed while both of the preliminarily selected signals have the same polarity.

In accordance with certain other aspects of the invention, apparatus is provided for selecting from a plurality of phase-distributed candidate clock signals the one of those signals that is closest in phase to transitions in another signal such as a CDR signal. The apparatus includes preliminary selection circuitry that selects two of the candidate clock signals that are adjacent to one another in phase, at least one of these preliminarily selected signals having no other candidate clock signal with phase between it and the transitions. The apparatus further includes final selection circuitry that selects the one of the preliminarily selected signals that has phase closer to the transitions, the final selection circuitry being operable to make a change in selection only when both of the preliminarily selected signals have the same polarity.

In accordance with still other aspects of the invention, the one of a plurality of candidate recovered clock signals that is closest in phase to transitions in another signal is selected by preliminarily selecting two of the candidate signals that are adjacent to one another in phase, a first of the prelimin- In accordance with yet another aspect of the invention, apparatus is provided for selecting from a plurality of phase-distributed candidate recovered clock signals the one of those signals that is closest in phase to transitions in another signal, the apparatus including phase detect circuitry for comparing the phase of a currently finally selected one of the candidate recovered clock signals to each of the transitions. The phase detect circuitry produces a first signal if the transition is later than the phase of the currently finally selected signal, and it produces a second signal if the transition is earlier than the phase of the currently finally selected signal. The apparatus further includes digital integrator circuitry for digitally integrating the first and second signals together. The apparatus still further includes preliminary selection circuitry for preliminarily selecting two phase-adjacent ones of the candidate recovered clock signals based on more significant information from the digital integrator circuitry, and final selection circuitry for finally selecting one of the two preliminarily selected signals based on less significant information from the digital integrator circuitry. And the apparatus includes delay circuitry for delaying response of the final selection circuitry to the less significant information relative to response of the preliminary selection circuitry to the concurrently produced, more significant information.

Further features of the invention, its nature and various advantages will be more apparent from the accompanying drawings and the following detailed description.

DETAILED DESCRIPTION

Illustrative circuitries that may employ DPLL circuitry are shown, for example, in Aung et al. U.S. patent application Ser. No. 09/805,843, filed Mar. 13, 2001, and Lee et al. U.S. patent application No. 10/059,014, filed Jan. 29, 2002. The circuitries shown in these references are also examples of circuitries in which the circuitry of this invention can be employed. Because these references provide illustrative contexts for the present invention, it will not be necessary herein to go into great detail about such contexts (although FIGS. 4 and 5 herein and the accompanying description of those FIGS. do provide some illustrative context information). For example, it will be assumed in what immediately follows that the input signals to the DPLL circuitry shown herein come from circuitry of the type shown in the references, and similarly that the signals output by the DPLL circuitry shown herein are employed as shown in the references. All context information assumed or provided herein is only illustrative. Many other contexts are also possible.

Figure 1:
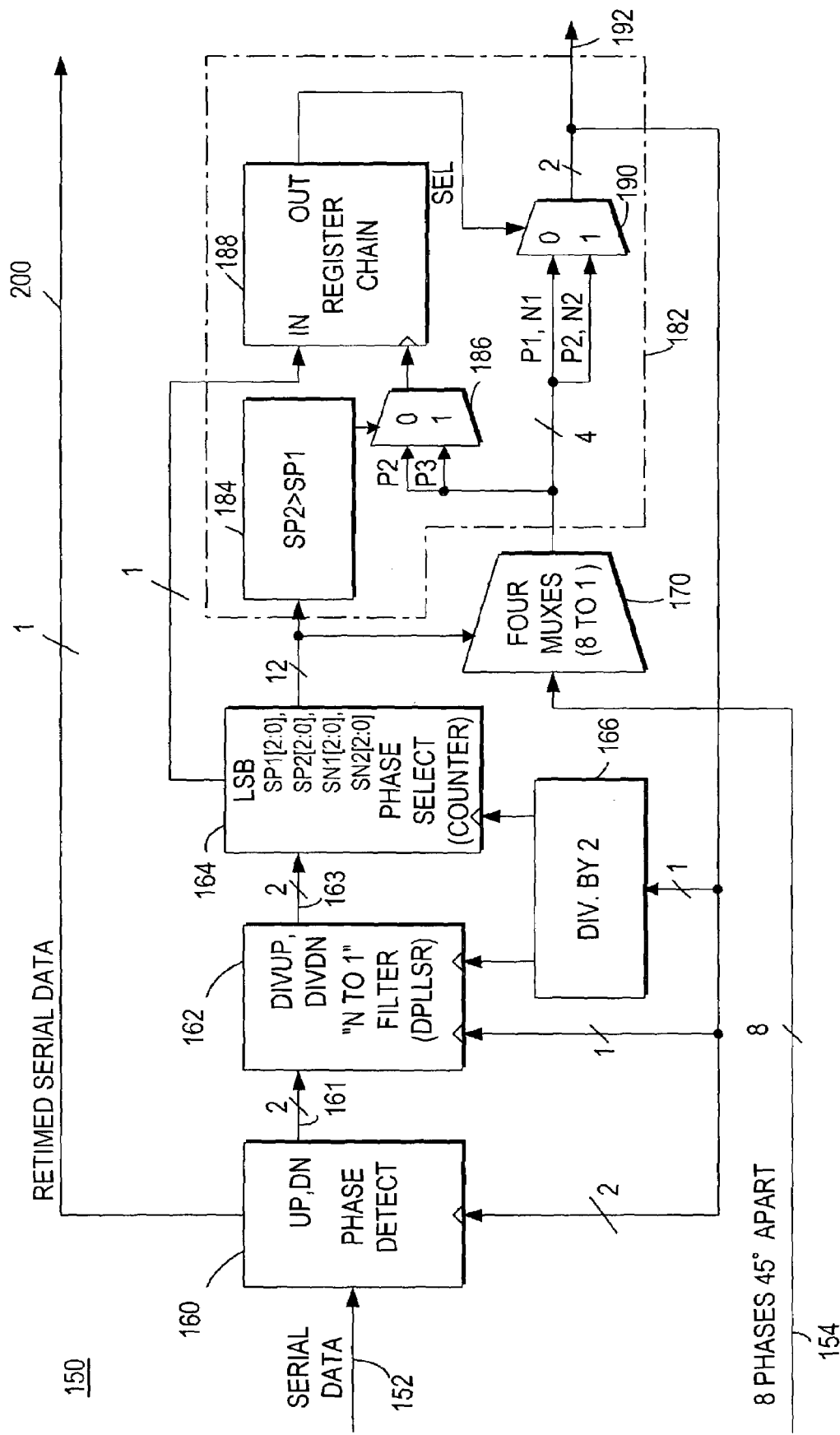
FIG. 1 is a simplified schematic block diagram of an illustrative embodiment of circuitry in accordance with the invention.

Turning now to FIG. 1, DPLL circuitry 150 receives serial data (e.g., a CDR signal) via lead 152. DPLL circuitry 150 also receives eight candidate recovered clock signals via leads 154. These eight candidate recovered clock signals all have the same frequency, which matches the frequency of clock information in the CDR signal on lead 152. However, the phases of the eight candidate recovered clock signals on leads 154 are all different. Preferably the shift in phase from one of these signals to the next is substantially equal to one-eighth of a cycle of any one of these signals. Thus the phase of each of the signals on leads 154 is shifted by 45° from the preceding signal in the group when the signals are ordered on the basis of phase. In other words, the eight signals on leads 154 collectively divide one full cycle of any of these signals into eight equal fractions. DPLL circuitry 150 operates (as will be described later herein) to select two of the eight signals on leads 154 as final recovered clock signals on leads 192. Omitting for the moment details that will be discussed later, the two signals thus finally selected are in general the true and complement of the candidate reference clock signal having the phase that best matches the phase of the clock information in CDR signal 152. Operation of the FIG. 1 circuitry will now be discussed in more detail.

The recovered clock signals on leads 192 are applied as clock signals to phase detect circuitry 160. This circuitry compares the phases of transitions in CDR signal 152 to phases of the recovered clock signals (from leads 192) and produces "UP" or "DN" signal pulses on leads 161, depending on whether the phase of the recovered clock signals needs to be delayed ("UP") or advanced ("DN") to make the recovered clock signals better match the phase of transitions in CDR signal 152. In circuitry 160 the recovered true clock signal may be compared in phase to positive-going transitions in CDR signal 152. The recovered complement clock signal may be compared in phase to negative-going transitions in CDR signal 152.

Circuitry 160 also uses recovered clock signals 192 to produce a retimed serial data signal on lead 200. This may be done, for example, by using an appropriate one (or a phase-shifted version of an appropriate one) of the recovered clock signals to clock CDR signal 152 into a register. The output signal of the register is the retimed serial data signal on lead 200.

Circuitry 162 operates as N-to-1 filter circuitry on the UP and DN signal pulses output by circuitry 160. For example, circuitry 162 may divide by an integer N (which is greater than 1) the number of UP pulses received to produce a "DIVUP" output signal pulse only after N UP pulses have been received. Circuitry 162 may do the same thing with respect to DN pulses, so that a "DIVDN" output signal pulse is produced only after N DN pulses have been received. The DIVUP and DIVDN signals are output via leads 163. A purpose of the filtering provided by circuitry 162 is to avoid reacting to the UP/DN signals before phase detect circuitry 160 has had a chance to examine the previously chosen phase and make an UP/DN decision based on that phase choice. N to 1 filter circuitry 162 is clocked by one of the recovered clock signals from leads 192, and also by a second clock signal that is one of the recovered clock signals 192 after frequency-halving by divide-by-2 circuitry 166. Some functions in circuitry 162 can be clocked at the full recovered clock rate. But other functions, such as synthesized counters, need the slower clock signal produced by divider circuitry 166.

DIVUP and DIVDN signals 163 respectively increment and decrement a counter in phase select circuitry 164. Circuitry 164 is also clocked by a frequency-halved recovered clock signal produced by divider circuitry 166. It will be appreciated that elements 162 and 164 effectively low-pass-filter and digitally integrate the UP and DN signals together (over time) to help smooth out the response of the circuitry to indications of need to change the phase of the recovered clock signal. It will also be appreciated that, in the particular embodiment being described, UP and DN signals are only produced in response to transitions in CDR signal 152. In the absence of further transitions in the CDR signal, the circuitry is therefore stable with respect to any recovered clock signal selection that has been made. As a consequence, the illustrative circuitry does not require CDR signal 152 to comply with any particular run length limitation. Run length monitoring circuitry can be added if desired.

The more significant bits ("MSB") of the count from the counter in circuitry 164 control "preliminary" selection of two pairs of two of the eight candidate recovered clocks 154. The two candidate recovered clock signals in each pair have phases that are separated by 45°, and the pairs are 180° out of phase with one another (i.e., the more phase-retarded signal in each pair is 180° out of phase with the more phase-retarded signal in the other pair, and the same is true for more phase-advanced signal in each pair). In the immediately following discussion we will first give primary consideration to only one of the above-mentioned pairs (i.e., the signals referred to as P1 and P2). Later we will come back and supplement the consideration of the other pair (i.e., the signals referred to as N1 and N2).

Considering first the selection of signals P1 and P2, these are two phase-adjacent ones of the eight candidate recovered clock signals on leads 154. These two selected signals are "phase-adjacent" because they have the smallest possible phase difference (45°) between them. At various times during operation of the circuitry, any two candidate recovered clock signals, separated in phase by 45°, may be selected as P1 and P2 based on the MSB of the circuitry 164 counter. At any given time, however, (after the circuitry has been in operation long enough to have reached reasonable stability) the two candidate recovered clock signals that are selected as P1 and P2 by the MSB of the circuitry 164 counter are the two signals having phases that most nearly match the phase of positive-going transitions in the clock information in CDR signal 152. This generally means that one of the selected signals will have phase that is somewhat behind the phase of positive-going transitions in the CDR signal clock, and the other selected signal will have phase that is somewhat ahead of the phase of positive-going transitions in the CDR signal clock. In other words, the circuitry attempts to keep the phase of positive-going transitions in the CDR signal clock information between the phases of the two candidate recovered clock signals selected as P1 and P2 by the MSB of the circuitry 164 counter.

Multiplexer circuitry 170 actually makes the selection of the two candidate recovered clock signals P1 and P2 as described in the preceding paragraph. Multiplexer circuitry 170 is controlled to make these selections by SP1[2:0] and SP2[2:0] output signals of phase select circuitry 164. These SP1 or SP2 signals are derived from the above-described MSB information. Although any other consistent convention could be used, in the illustrative embodiment being described herein, the higher the value represented by SP1 or SP2, the later (more delayed) the phase of the candidate recovered clock signal that will be selected in response to that SP1 or SP2 value. As has already been anticipated, the two signals selected by the SP1 and SP2 signals are respectively referenced P1 and P2 in FIG. 1.

Only one of the two sets of signals SP1 and SP2 is allowed to change at any one time. For example, if SP1 and SP2 are selecting candidate recovered clock signals P1 and P2 having phases that are respectively behind and ahead of the CDR signal clock information phase, and if it is then found that the phase of P2 is now also behind the phase of the CDR signal clock information, SP2 (and therefore P2) does not change. Only SP1 (and therefore P1) changes. In particular, the change in SP1 is from selecting the candidate signal having phase behind the phase of P2 to selecting the candidate signal having phase ahead of the phase of P2. In this way the phase of the CDR clock information remains between the phases of P1 and P2, but only one signal selection (in this example the selection of P1) changes at any one time. Thus there is always one set of signals SP1 or SP2 that is unchanged during any change in the other set of the SP1/SP2 signals. By the same token, there is always one of signals P1 or P2 that is uninterruptedly output by circuitry 170 during any change in the other P1/P2 signal output by that circuitry.

At the same time that multiplexer circuitry 170 is selecting P1 and P2 as described above, that circuitry also selects the complements of P1 and P2 (referred to as N1 and N2, respectively). (All "complement" signals are 180° out of phase with the corresponding "true" signal.) The SN1[2:0] and SN2[2:0] output signals of phase select circuitry 164 control circuitry 170 to make these complement signal selections.

A final selection of one of signals P1 and P2 for use as the recovered clock signal is made by so-called digital interpolator circuitry 182. Within circuitry 182, circuitry 184 compares the SP1 and SP2 information. If SP2 is greater than SP1, the phase of P2 is later (more retarded or delayed) than the phase of P1. In that case compare circuitry 184 causes multiplexer circuitry 186 to select P2 for application to the clock input terminal of register chain 188. On the other hand, if SP1 is greater than SP2, the phase of P1 is later (more retarded or delayed) than the phase of P2. In that case compare circuitry 184 causes multiplexer circuitry 186 to select P1 for application to the clock input terminal of register chain 188. From the foregoing it will be seen that multiplexer circuitry 186 always outputs the one of signals P1 and P2 with the later phase. It will also now be appreciated why it is desirable for only one set of signals SP1 or SP2 to be allowed to change at any one time (e.g., to increase the reliability of operation of comparison circuitry 184).

The data input to register chain 188 is a less significant bit ("LSB") of the count in the above-described counter in phase select circuitry 164. The LSB information can be the least significant bit of the count in the circuitry 164 counter, or if there are several bits in that counter with significance less than the previously described MSB information, the LSB can be one of those less significant bits (preferably the bit with significance just less than the MSB information). The LSB signal propagates through register chain 188 at the rate of the clock signal (P1 or P2) applied to the clock input of that chain from the output of multiplexer 186. After thus propagating through register chain 188, the LSB signal information is output by that chain as final selection signal SEL. The SEL signal is used to control multiplexer circuitry 190 to select either P1 and N1 or P2 and N2 as the recovered clock signal and its complement. In particular, if SEL is 0, circuitry 190 selects P1 and N1 for application to leads 192. If SEL is 1, circuitry 190 selects P2 and N2 for application to leads 192.

Reviewing the operation of the circuitry from a relatively high level, the phase of the clock signal applied to register chain 188 can change by no more than 45° at any one time. This helps register chain 188 continue to operate satisfactorily during any change in the signal selected by multiplexer 186. Register chain 188 delays the time between any change in the LSB information and the use of that information (as SEL) to cause a change in the selection of P1/N1 or P2/N2 for application to leads 192. If the MSB and LSB information both change at the same time, the delay in use of the LSB information that results from passing that information through register chain 188 prior to use to control multiplexer 190 prevents a change in candidate clock signal selection by multiplexer 190 from occurring too close in time to a change in candidate clock signal selection by more upstream multiplexers 170 and 186. This means that any change in ("preliminary") selections by multiplexers 170 and 186 has been made and the results of those selections have been well stabilized before any change in further ("final") selection among those preliminary selections can be attempted and made by multiplexer 190. Ensuring in this way that the initial or preliminary selections (by multiplexers 170 and 186) and the final selections (by multiplexer 190) are well spaced apart in time helps ensure that the final selections (the recovered clock signals on leads 192) are free of "glitches", even when those final selections change, as they typically do at least from time to time. After the immediately following additional point, further glitch-preventing aspects of the circuitry will be discussed in connection with FIG. 2.

Before leaving FIG. 1, it should be pointed out (if it is not already apparent from what has been said) that whenever a change is made in the preliminary selections by multiplexer circuitry 170, the LSB information will typically already be causing multiplexer circuitry 190 to finally select the signals P1/N1 or P2/N2 that will not change as a result of the preliminary selection change. This is so because (as has been said) only one of the two sets of signals preliminarily selected by multiplexer circuitry 170 is allowed to change at any one time. Moreover, the set that is allowed to change is the set that is more distant in phase from transitions in CDR signal 152. But before that preliminary selection change occurs, the LSB/SEL information will have caused the final selection (via operation of multiplexer circuitry 190) to be selection of the preliminarily selected set that is closer in phase to transitions in CDR signal 152. So, although a change in preliminary selection is immediately reflected at one set of the inputs to multiplexer circuitry 190, that has no immediate effect on the outputs of circuitry 190 because SEL is then causing circuitry 190 to derive its outputs from its other set of inputs. And there is no change in the signals applied to that other set of circuitry 190 inputs. Only well after a change in one of the sets of inputs to circuitry 190 can SEL change to cause final selection of that changed set of inputs. This is ensured by operation of delay circuitry 188, which delays any change in LSB prior to appearance of that change in SEL. This description, of course, assumes normal operation of the circuitry.

Figure 2:
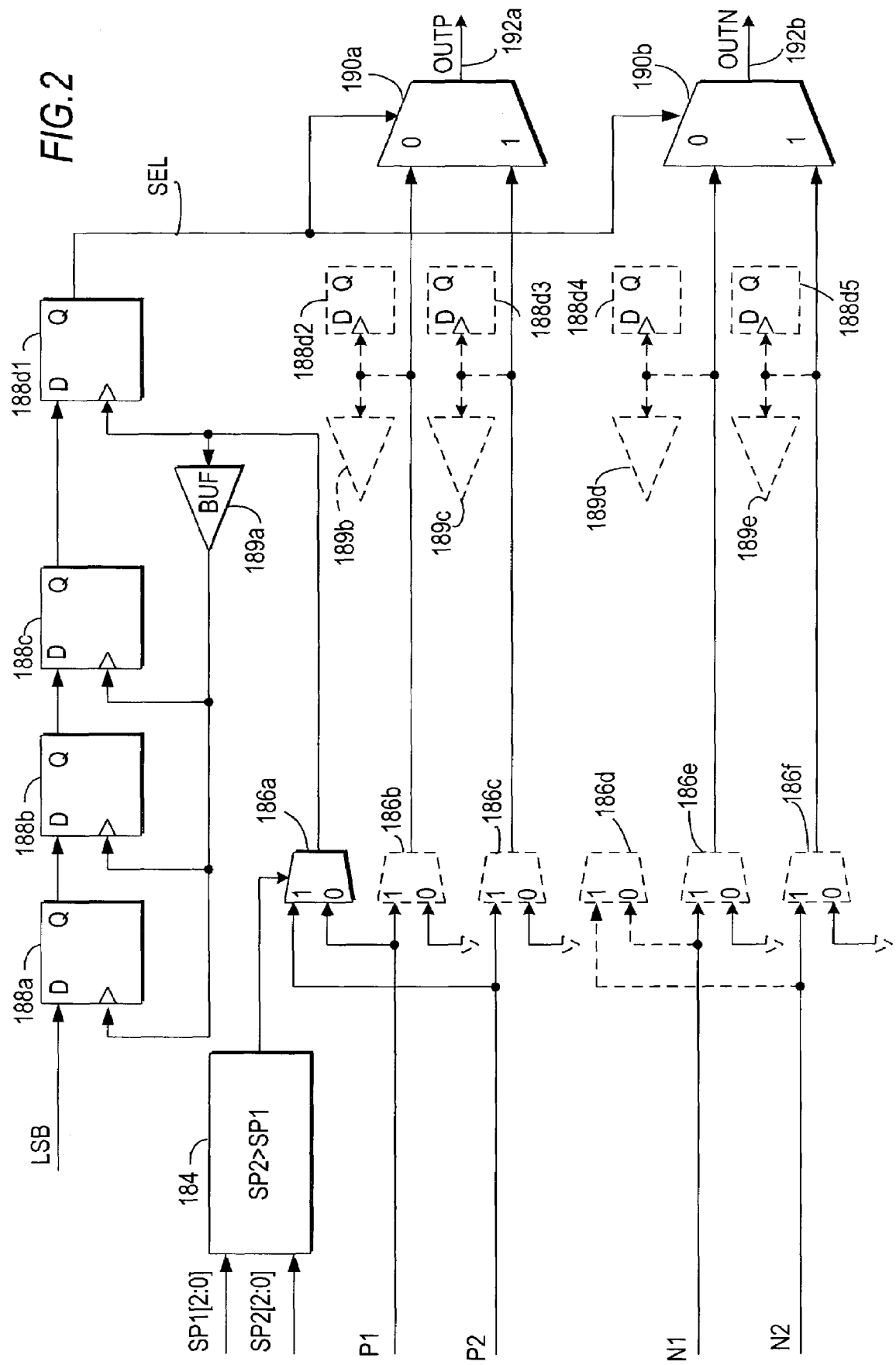
FIG. 2 is a more detailed, but still simplified schematic block diagram of an illustrative embodiment of a portion of the FIG. 1 circuitry in accordance with the invention.

Turning now to FIG. 2, that FIG. shows an illustrative embodiment of digital interpolator circuitry 182 in somewhat more detail. The portions of this circuitry that relate to selection of OUTP (the finally selected recovered clock on lead 192a) will be discussed first. Then the similar circuitry for selecting the complement of OUTP (i.e., OUTN on lead 192b) will be discussed.

As has already been said, the final selection between P1 and P2 is controlled by LSB. An LSB transition should not cause a glitch in the output clock OUTP (or OUTN). To prevent such a glitch, LSB is forced to transition at the final output mux 190a only when P1 and P2 are the same logic state (high or low). (The same is true for N1 and N2, i.e., they are forced to be in the same logic state when LSB transitions at final output mux 190b.)

First, SP1 and SP2 are compared in circuitry 184, and the later phase clock among P1 and P2 is selected to register LSB. For example, if SP1=2 and SP2=1, then the phase of P1 is greater (later) than the phase of P2 and therefore P1 is selected to register LSB.

Figure 3:
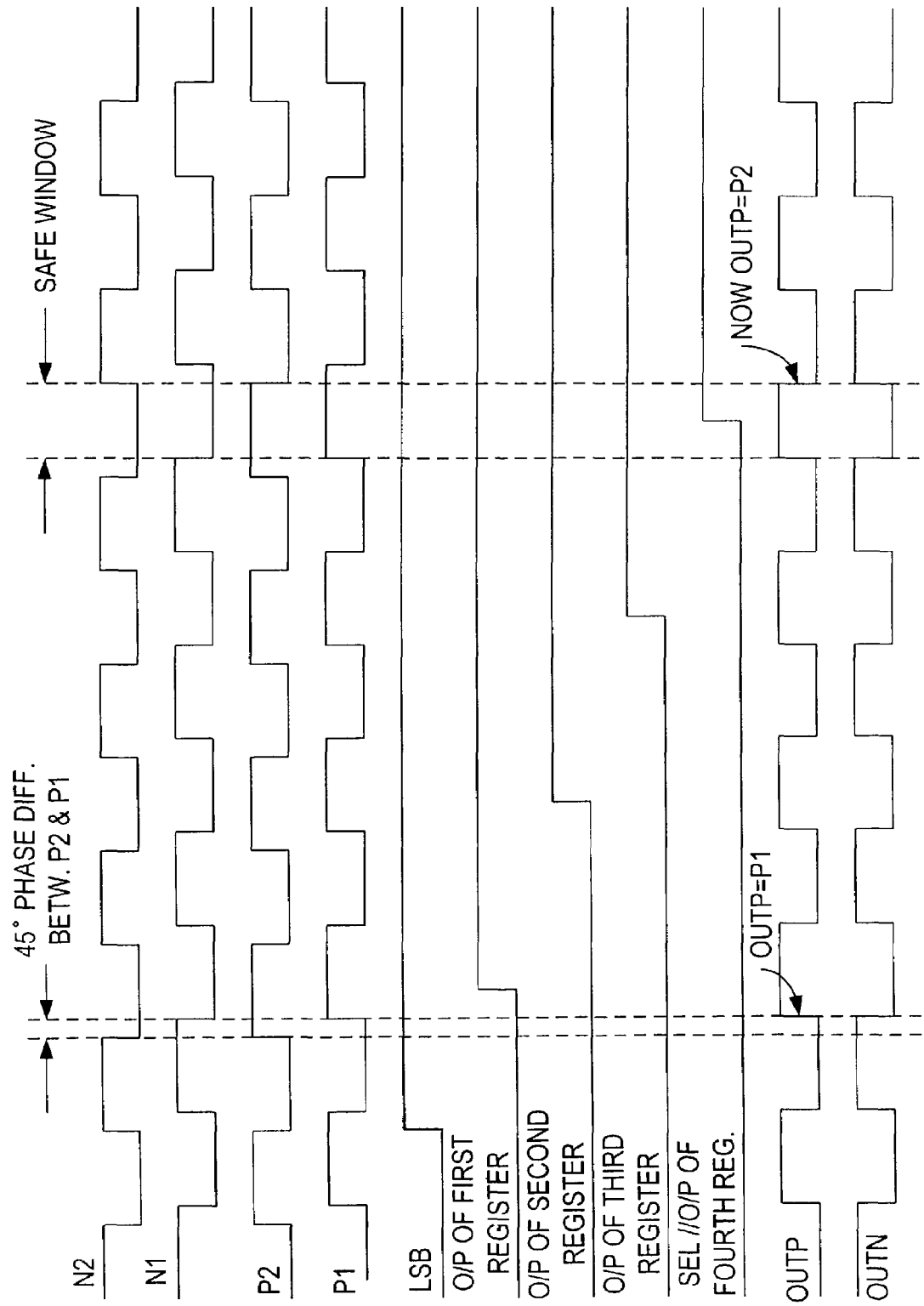
FIG. 3 shows several illustrative signal waveforms that are useful in explaining certain aspects of the invention. All of these waveforms are drawn with reference to a common horizontal time-line, along which time increases to the right.

The waveforms in FIG. 3 illustrate the glitch-free operation of the circuit in FIG. 2. The "safe window" in FIG. 3 shows the area where SEL is guaranteed to switch. As can be seen from FIG. 3, P1=P2 and N1=N2 in this safe window. This ensures that SEL changing state and causing a change in the sources of output clocks OUTP and OUTN does not cause a glitch in OUTP and OUTN (because both possible sources for each of those signals then have the same logic level).

Another characteristic of the circuitry that helps to ensure glitch-free operation is that the TCO (time from clock to output) of shift register stage 188d1 (FIG. 2) plus TSEL (time from a change in SEL to a change in the output of the multiplexers 190a and 190b controlled by SEL) is less than the "safe window" Also, the dummy loads (shown in dashed lines in FIG. 2 (e.g., multiplexers 186b–f, registers 188d2–5, and buffers 189b–e)) help to match the delays between the five clocks (i.e., P1, P2, N1, N2, and the clock to the fourth register 188d1 in register chain 188a–188d1).

Figure 4:
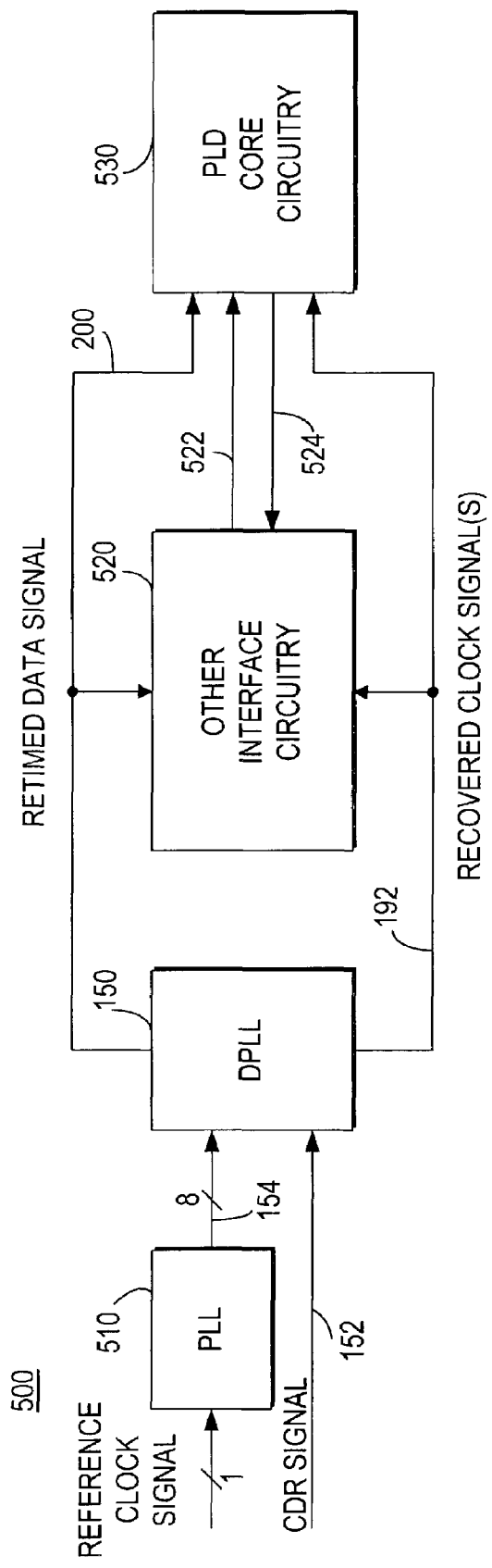
FIG. 4 is a simplified block diagram of illustrative, more extensive circuitry that can include circuitry of the type shown in FIG. 1 in accordance with the invention.

Illustrative circuitry 500 in which DPLL circuitry as described above can be used in accordance with the invention is shown in FIG. 4. Circuitry 500 is assumed to be programmable logic device ("PLD") circuitry. Phase locked loop ("PLL") circuitry 510 receives a reference clock signal having frequency related to the frequency of the clock information in the CDR signal 152 also received by circuitry 500. For example, the reference clock signal frequency can be the same as the frequency of the CDR signal clock information, or there can be an integer multiple relationship between these two frequencies. PLL 510 produces the above-described eight candidate recovered clock signals on leads 154. DPLL 150 uses the signals on leads 154 and CDR signal 152 to produce final recovered clock signal(s) 192 and retimed data signal 200. These signals may be used and/or further processed in other interface circuitry 520, and/or they may be applied to PLD core circuitry 530 (e.g., the general-purpose programmable logic circuitry of PLD 500). Examples of other interface circuitry 520 that may be included are (1) byte alignment circuitry, (2) 8-bit/10-bit decoding circuitry, (3) channel de-skew circuitry, (4) byte de-serializer circuitry, (5) decryption circuitry, etc. Examples of such possible other interface circuitry 520 are shown in such references as Aung et al. U.S. patent application Ser. No. 09/805,843, filed Mar. 13, 2001, Lee et al. U.S. patent application Ser. No. 10/059,014, filed Jan. 29, 2002, Lee et al. U.S. Pat. No. 6,650,140, Venkata et al. U.S. patent application Ser. No. 10/195,229, filed Jul. 11, 2002, Venkata et al. U.S. patent application Ser. No. 10/273,899, filed Oct. 16, 2002, Venkata et al. U.S. Pat. No. 6,854,044, and Venkata et al. U.S. patent application Ser. No. 10/317,264, filed Dec. 10, 2002 . Other interface circuitry 520 may exchange signals with PLD core circuitry 530 via leads 522 and 524. For example, signals for controlling certain operations of circuitry 520 may come from PLD core circuitry 530 via leads 524. Further processed data signals and/or signals indicating the status of various aspects of circuitry 520 operation may be applied to circuitry 530 via leads 522. There may be still other connections (not shown) between various elements in FIG. 4. For example, PLL 510 and/or DPLL 150 may indicate "loss of lock" to circuitry 530. As another example, DPLL 150 may include circuitry for monitoring the run length of CDR signal 152 and may indicate any "run length violation" to circuitry 530.

Figure 5:
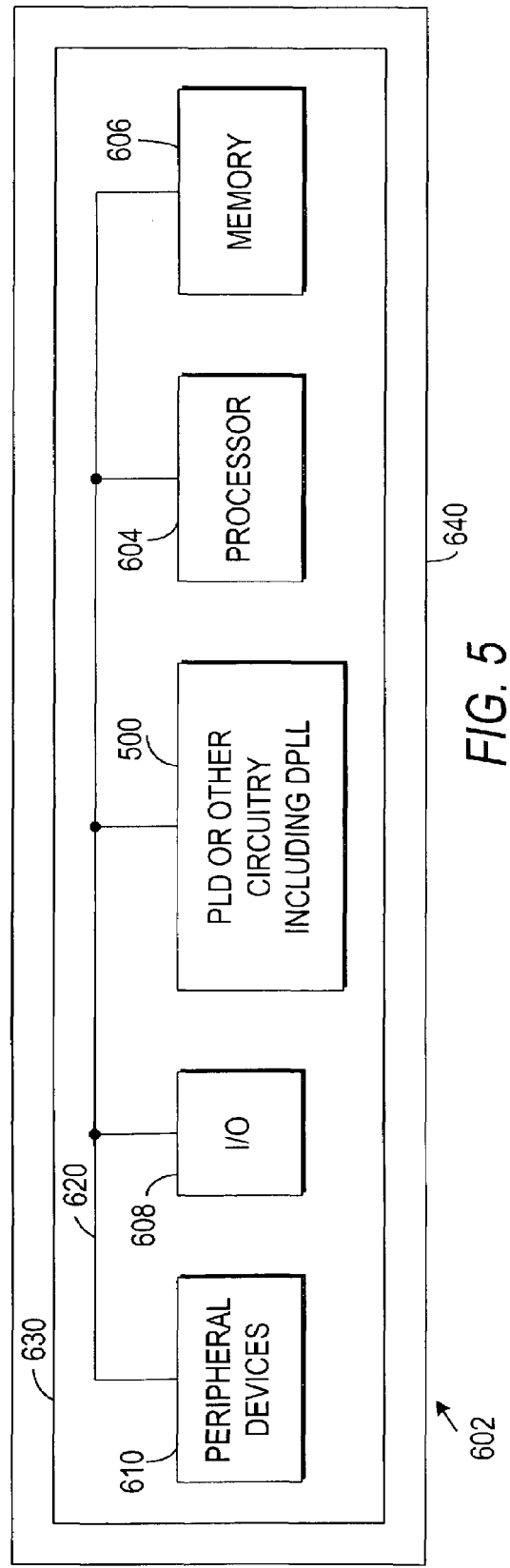
FIG. 5 is a simplified block diagram of an illustrative system employing circuitry in accordance with the invention.

FIG. 5 illustrates a PLD or other circuitry 500 like that illustrated by FIG. 4 in a data processing system 602 in accordance with the invention. Data processing system 602 may include one or more of the following components: a processor 604; memory 606; I/O circuitry 608; and peripheral devices 610. These components are coupled together by a system bus or other interconnections 620 and are populated on a circuit board 630 (e.g., a printed circuit board), which is contained in an end-user system 640. Any of the interconnections between element 500 and any other elements may be made using the above-described CDR signaling.

System 602 can be used in a wide variety of applications, such as computer networking, data networking, instrumentation, video processing, digital signal processing, or any other application where the advantage of using programmable or reprogrammable logic is desirable. Circuitry 500 can be used to perform a variety of different logic functions. For example, circuitry 500 can be configured as a processor or controller that works in cooperation with processor 604. Circuitry 500 may also be used as an arbiter for arbitrating access to a shared resource in system 602. In yet another example, circuitry 500 can be configured as an interface between processor 604 and one of the other components in system 602. It should be noted that system 602 is only exemplary, and that the true scope and spirit of the invention should be indicated by the following claims.

It will be understood that the foregoing is only illustrative of the principles of the invention, and that various modifications can be made by those skilled in the art without departing from the scope and spirit of the invention. For example, the number of registers 188a–d1 in register chain 188 can be varied (e.g., increased from four) if desired. As another example of possible modifications, the use of eight candidate recovered clock signals 154 is only illustrative, and any other suitable, larger or smaller, plural number of such signals can be used instead if desired.

The invention claimed is:

1. A method of selecting from a plurality of phase-distributed candidate clock signals the one of said candidate clock signals that has phase closest to transitions in a data signal comprising:
preliminarily selecting two of the candidate clock signals that are adjacent to one another in phase, at least one of the preliminarily selected candidate clock signals having no other candidate clock signal with phase between it and the transitions; and
allowing a change in a final selection between the preliminarily selected candidate clock signals only while both of the preliminarily selected candidate clock signals have the same polarity.

2. The method defined in claim 1 further comprising:
finally selecting the one of the preliminarily selected candidate clock signals that has phase closer to the transitions, subject to the allowing step.

3. The method defined in claim 1 wherein the preliminarily selected candidate clock signals have phases that respectively lead and lag the transitions.

4. The method defined in claim 1 further comprising:
delaying any change in the final selection relative to a most recent change in the candidate clock signals selected in the preliminarily selecting.

5. The method defined in claim 4 further comprising:
selecting the one of the preliminarily selected candidate clock signals having the more delayed phase to at least partly control performance of the delaying.

6. The method defined in claim 1 wherein the data signal is a CDR signal including clock information indicated by the transitions.

7. The method defined in claim 6 wherein a change in the final selection can be made only in response to the transitions.

8. Apparatus for selecting from a plurality of phase-distributed candidate clock signals the one of said candidate clock signals that has phase closest to transitions in a data signal comprising:
preliminary selection circuitry that selects two of the candidate clock signals that are adjacent to one another in phase, at least one of these preliminarily selected candidate clock signals having no other candidate clock signal with phase between it and the transitions; and
final selection circuitry that selects the one of the preliminarily selected candidate clock signals that has phase closer to the transitions, the final selection circuitry being operable to make a change in selection only when both of the preliminarily selected candidate clock signals have the same polarity.

9. The apparatus defined in claim 8 further comprising:
delay circuitry that prevents the final selection circuitry from making a change in selection until at least a predetermined time interval after a most recent change in selection by the preliminary selection circuitry.

10. The apparatus defined in claim 9 wherein the delay circuitry is responsive to the one of the candidate clock signals selected by the preliminary selection circuitry that has the more delayed phase to release the final selection circuitry to make a change in selection.

11. The apparatus defined in claim 8 wherein the two preliminarily selected candidate clock signals have phases that respectively lead and lag the transitions.

12. The apparatus defined in claim 8 wherein the preliminary selection circuitry and the final selection circuitry are stable with respect to their signal selections during any time interval between the transitions.

13. A digital processing system comprising:
processing circuitry;
a memory coupled to said processing circuitry; and
apparatus as defined in claim 8 coupled to the processing circuitry and the memory.

14. A printed circuit board on which is mounted apparatus as defined in claim 8.

15. The printed circuit board defined in claim 14 further comprising:
a memory mounted on the printed circuit board and coupled to the apparatus.

16. The printed circuit board defined in claim 14 further comprising:
processing circuitry mounted on the printed circuit board and coupled to the apparatus.

17. A method of selecting from a plurality of phase-distributed candidate recovered clock signals the one of said candidate recovered clock signals that has phase closest to transitions in a data signal comprising:
preliminarily selecting two of the candidate recovered clock signals that are adjacent to one another in phase, a first of the preliminarily selected candidate recovered clock signals having phase earlier than the transitions, and a second of the preliminarily selected candidate recovered clock signals having phase later than the transitions;
using the second preliminarily selected candidate recovered clock signal to clock a final selection request signal through a delay chain; and
using the final selection request signal output by the delay chain to make a final selection between the preliminarily selected candidate recovered clock signals.

18. The method defined in claim 17 wherein the data signal is a CDR signal including clock information.

19. The method defined in claim 18 wherein the candidate recovered clock signals have a common frequency that has a predetermined relationship to a frequency of the clock information.

20. The method defined in claim 19 wherein the predetermined relationship is substantial equality.

21. The method defined in claim 17 wherein each candidate recovered clock signal has phase that is equally shifted relative to phases of two others of the candidate recovered clock signals that are closest to it in phase.

22. Apparatus for selecting from a plurality of phase-distributed candidate recovered clock signals the one of said candidate recovered clock signals that is closest in phase to transitions in a data signal comprising: phase detect circuitry for comparing the
phase of a currently finally selected one of the candidate recovered clock signals to each of the transitions, for producing a first signal if the transition is later than the phase of the currently finally selected candidate recovered clock signal, and for producing a second signal if the transition is earlier than the phase of the currently finally selected candidate recovered clock signal;
digital integrator circuitry for digitally integrating the first and second signals together;
preliminary selection circuitry for preliminarily selecting two phase-adjacent ones of the candidate recovered clock signals based on more significant information from the digital integrator circuitry;
final selection circuitry for finally selecting one of the two preliminarily selected candidate recovered clock signals based on less significant information from the digital integrator circuitry; and
delay circuitry for delaying response of the final selection circuitry to the less significant information relative to response of the preliminary selection circuitry to concurrently produced more significant information.

23. The apparatus defined in claim 22 further comprising:
circuitry for applying the one of the two preliminarily selected candidate recovered clock signals that has the later phase to the delay circuitry for controlling the timing of operation of the delay circuitry.

24. The apparatus defined in claim 23 wherein the circuitry for applying comprises:
selection circuitry for selecting the one of the two preliminarily selected candidate recovered clock signal that has the later phase.

25. The apparatus defined in claim 22 wherein the digital integrator circuitry comprises:
    filter circuitry for suppressing at least some of the first and second signals; and
    counter circuitry for receiving and counting the first and second signals that are not suppressed by the filter circuitry.

26. The apparatus defined in claim 25 wherein the counter circuitry counts in a first direction in response to the first signals that it receives and in an opposite second direction in response to the second signals that it receives.

27. The apparatus defined in claim 22 further comprising:
    circuitry for clocking operation of the digital integrator circuitry based on the finally selected one of the candidate recovered clock signals.

28. The apparatus defined in claim 22 wherein the delay circuitry delays response of the final selection circuitry until a time when both of the preliminarily selected candidate recovered clock signals have the same polarity.

* * * * *